(12) United States Patent
Chen et al.

(10) Patent No.: US 11,211,771 B2
(45) Date of Patent: Dec. 28, 2021

(54) APPARATUS AND METHOD OF HIGH POWER NANOSECOND MODE-LOCKED SOLID STATE LASER

(71) Applicant: Hong Yang Laser Service Co., Ltd., Tainan (TW)

(72) Inventors: Yung-Fu Chen, Hsinchu (TW); Hsing-Chih Liang, Hsinchu (TW); Tzu-Lin Huang, Hsinchu (TW); Shu-Ching Li, Hsinchu (TW); Chia-Han Tsou, Hsinchu (TW)

(73) Assignee: HONG YANG LASER SERVICE CO., LTD., Tainan (TW)

( * ) Notice: Subject to any disclaimer, the term of this patent is extended or adjusted under 35 U.S.C. 154(b) by 203 days.

(21) Appl. No.: 16/668,597

(22) Filed: Oct. 30, 2019

(65) Prior Publication Data
US 2020/0403374 A1   Dec. 24, 2020

(30) Foreign Application Priority Data
Jun. 24, 2019 (TW) .................................. 108122024

(51) Int. Cl.
| H01S 5/065 | (2006.01) |
| H01S 5/02 | (2006.01) |
| H01S 5/00 | (2006.01) |
| H01S 5/04 | (2006.01) |

(52) U.S. Cl.
CPC ............ *H01S 5/065* (2013.01); *H01S 5/0071* (2013.01); *H01S 5/0206* (2013.01); *H01S 5/041* (2013.01)

(58) Field of Classification Search
CPC ...... H01S 5/065; H01S 5/0071; H01S 5/0206; H01S 3/08027; H01S 3/06; H01S 5/142; H01S 3/0817; H01S 3/0621; H01J 5/00; H01J 23/207; H03B 2201/017; H03D 9/0625
See application file for complete search history.

(56) References Cited

U.S. PATENT DOCUMENTS

| 8,885,675 | B2 * | 11/2014 | Yamazaki | ............... | H01S 5/142 |
| | | | | | 372/20 |
| 9,059,565 | B1 * | 6/2015 | Kub | ....................... | B82Y 20/00 |

\* cited by examiner

*Primary Examiner* — Tuan N Nguyen
(74) *Attorney, Agent, or Firm* — Volpe Koenig

(57) ABSTRACT

A mode-locked solid state laser apparatus including an optical film, a gain medium crystal, a Fabry-Perot element, a first mirror, a second mirror, a third mirror and an output coupler is disclosed. The optical film is configured to receive a pumping light having a first wavelength incident in a first direction. The gain medium crystal receives the pumping light passing the optical film, and generates an initial laser beam having a second wavelength, wherein the initial laser beam forms a first optical path starting at one end thereof from the gain medium crystal. The Fabry-Perot element is disposed on the other end of the first optical path opposite to the one end, and reflects the initial laser beam along a second optical path having one end thereof starting from the Fabry-Perot element. The first mirror is disposed on the other end of the second optical path opposite to the one end of the second optical path, and reflects the initial laser beam along a third optical path having one end thereof starting from the first mirror.

20 Claims, 4 Drawing Sheets

APPARATUS AND METHOD OF HIGH POWER NANOSECOND MODE-LOCKED SOLID STATE LASER

CROSS-REFERENCE TO RELATED APPLICATION AND CLAIM OF PRIORITY

The application claims the benefit of Taiwan Patent Application No. 108122024, filed on Jun. 24, 2019, at the Taiwan Intellectual Property Office, the disclosures of which are incorporated herein in their entirety by reference.

FIELD OF THE INVENTION

The present invention is related to a solid state apparatus and method, and more particularly to the apparatus and method of high power nanosecond mode-locked solid state laser.

BACKGROUND OF THE INVENTION

Solid state laser systems are commonly used to provide high-power laser sources, and are also well-adapted for constructing mode-locked lasers to generate laser pulses. Please refer to FIG. 1, which is a schematic diagram of a configuration of a solid-state laser resonant cavity known in the art. According to FIG. 1, the resonant cavity 10 is composed of an optical film 11, an optical gain crystal 12, a concave mirror 13, a mirror 14, and an output mirror 15. When the pumping light $L_{pump}$ enters the optical gain crystal 12 through the optical film 11, the optical gain medium in the crystal can be excited to release an initial laser beam $L_{ini}$ having a group of wavelengths close to another wavelength $\lambda$, along the light path shown in the figure. After zigzagging between the combination of the concave mirror 13 and the mirror 14, the initial laser beam $L_{ini}$ is directed toward the output mirror 15 via the lowermost light path in FIG. 1. In an appropriate configuration, the output mirror 15 can reflect the initial laser beam $L_{ini}$ back along the original path, so that the initial laser beam $L_{ini}$ is continuously reflected back and forth along the light path in the figure to form a closed path with the optical film 11 and the output mirror 15 at both ends.

Those skilled in the art can appreciate that in such a constantly closed path, there may be many forms of standing waves with specific wavelengths, which may be referred to as various modes. Therefore, the intensity of the initial laser beam $L_{ini}$ having the specific wavelengths can be continuously increased in the resonant cavity 10, along with the pumping light $L_{pump}$ continuously being injected into the optical gain crystal 12.

The film stack 151 of the output mirror 15 is a semiconductor saturable absorber mirror (SESAM) for achieving passive mode locking, and the transmittance thereof has an initial value. When the intensity of the initial laser beam $L_{ini}$ exceeds a threshold, the modes of the laser beam inside the cavity will be superimposed in a specific relationship and a pulse will be generated. Meanwhile, the film stack 151 causes a minimum loss to form a high penetration state, and a pulsed output laser light $L_{exit}$ is released through the output mirror 15.

The laser light pulse generated by the solid-state laser device described above consists of a group of light beams having mode wavelengths close to the wavelength $\lambda$, and the width of the wavelength region of the modal distribution shall be controlled for the application. For the purpose of mode selection, a typical way is to arrange a transmitted Fabry-Perot element 16 in the light path of the resonant cavity 10.

The conventional transmitted Fabry-Perot element consists essentially of two mutually parallel and low-reflectivity optical planes (for example, glass with two flat surfaces). When a homogenous light passes through the transmitted Fabry-Perot element, an interference occurs due to multiple reflections of homogenous light in the two optical planes, which produces a periodic modulation in the output spectrum to select the mode type. When the transmitted Fabry-Perot element 16 in the figure is disposed in the optical path of the resonant cavity 10, interference occurs to the initial laser beam $L_{ini}$ in the optical path, the number of modes decreases, and the modes of the initial laser beam $L_{ini}$ tend to be concentrated, achieving the effect of mode selection. If one transmitted Fabry-Perot element 16 is not sufficiently enough, conventionally one may add another transmitted Fabry-Perot element 17 to the optical path to enhance the efficiency of the mode selection.

According to the abovementioned, in order to arrange the transmitted Fabry-Perot element 16/17 in the resonant cavity 10, complicated optical component alignment processes are required, which are labor intensive and time-consuming. Moreover, the transmitted Fabry-Perot element 16/17 causes a power loss, so that the power of the output laser light $L_{exit}$ decreases. Therefore, how to avoid the above shortcomings but achieve effective mode selection is a technical issue to be resolved.

In order to overcome the drawbacks set forth above in the prior art, a new design for the laser apparatus is required.

SUMMARY OF THE INVENTION

The present invention provides a novel concept for a solid state laser resonant cavity, using a reflected Fabry-Perot element to replace a reflection mirror, which is simple and time-saving without increasing the total number of optical elements in the resonant cavity. The present invention is advantageous over the apparatus according to the prior art, no matter in terms of power performance or mode selection.

In accordance with one aspect of the present invention, a mode-locked solid state laser apparatus including an optical film, a gain medium crystal, a Fabry-Perot element, a first mirror, a second mirror, a third mirror and an output coupler is provided. The optical film is configured to receive a pumping light having a first wavelength incident in a first direction. The gain medium crystal receives the pumping light passing the optical film, and generates an initial laser beam having a second wavelength, wherein the initial laser beam forms a first optical path starting at one end thereof from the gain medium crystal. The Fabry-Perot element is disposed on the other end of the first optical path opposite to the one end, and reflects the initial laser beam along a second optical path having one end thereof starting from the Fabry-Perot element. The first mirror is disposed on the other end of the second optical path opposite to the one end of the second optical path, and reflects the initial laser beam along a third optical path having one end thereof starting from the first mirror. The second mirror is disposed on the other end of the third optical path opposite to the one end of the third optical path, and reflects the initial laser beam along a fourth optical path having one end thereof starting from the second mirror. The third mirror is disposed on the other end of the fourth optical path opposite to the one end of the fourth optical path, and reflects the initial laser beam along a fifth optical path having one end thereof starting from the third mirror. The output coupler is disposed on the other end of the fifth optical path opposite to the one end of the fifth optical path, and reflects the initial laser beam back to the third mirror along the fifth optical path. The optical film has a first relatively high transmittance for a light at the first wavelength and a first relatively high reflectivity for a light at the second wavelength. The Fabry-Perot element includes a first surface and a second surface parallel to the first surface, wherein the first surface is closer to the first mirror when compared to the second surface and has a second relatively high transmittance, and the second surface has a second relatively high reflectivity. The output coupler has an initial transmittance. On a condition when an intensity of the initial laser beam reaches a threshold value, the output coupler has a third relatively high transmittance and allows an output laser pulse to emit out of the laser apparatus.

In accordance with another aspect of the present invention, a mode-locked solid state laser apparatus is disclosed. The mode-locked solid state laser apparatus comprises an optical film, a gain medium crystal, a concave mirror, a Fabry-Perot element and an output coupler. The optical film is configured to receive a pumping light having a first wavelength incident in a first direction. The gain medium crystal receives the pumping light passing the optical film, and generates an initial laser beam having a second wavelength, wherein the initial laser beam forms a first optical path starting at one end thereof from the gain medium crystal. The concave mirror is disposed on the other end of the first optical path opposite to the one end of the first optical path, and reflects the initial laser beam along a second optical path starting at one end thereof from the concave mirror. The Fabry-Perot element is disposed on the other end of the second optical path opposite to the one end thereof, and reflects the initial laser beam back to the concave mirror so as to reflect the initial laser beam by the concave mirror along a third optical path starting at one end thereof from the concave mirror. The Fabry-Perot element includes a first surface and a second surface parallel to the first surface, and the first surface is closer to the concave mirror when compared to the second surface. The output coupler is disposed on the other end of the third optical path opposite to the one end thereof, and reflects the initial laser beam back to the concave mirror along the third optical path.

In accordance with yet another aspect of the present invention, a method for adjusting a pulse width of a solid-state laser pulse is provided. The method comprises steps of: (A) providing a solid state laser device including: an optical film receiving a pumping light having a first wavelength incident in a first direction; a gain medium crystal, receiving the pumping light passing the optical film, and generating an initial laser beam having a second wavelength, wherein the initial laser beam forms a first optical path starting at one end thereof from the gain medium crystal; a concave mirror, disposed on the other end of the first optical path opposite to the one end thereof, and reflecting the initial laser beam along a second optical path starting at one end thereof from the concave mirror; a Fabry-Perot element, disposed on the other end of the second optical path opposite to the one end thereof, and reflecting the initial laser beam back to the concave mirror so as to reflect the initial laser beam by the concave mirror along a third optical path starting at one end thereof from the concave mirror, wherein the Fabry-Perot element including a first surface and a second surface parallel to the first surface, wherein the first surface is closer to the concave mirror when compared to the second surface and has a first relatively high transmittance, and the second surface has a first relatively high reflectivity; and an output coupler disposed on the other end of the third optical path opposite to the one end thereof, and releasing the solid-state laser pulse having the pulse width; and (B) controlling the thickness to adjust the pulse width.

The mode-locked solid state laser apparatus and relevant methods provided by the present invention can be applied usefully in semiconductor manufacturing processes. Thus, the present invention has utility for industry.

The objectives and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; they are not intended to be exhaustive or to be limited to the precise form disclosed.

Figure 2:
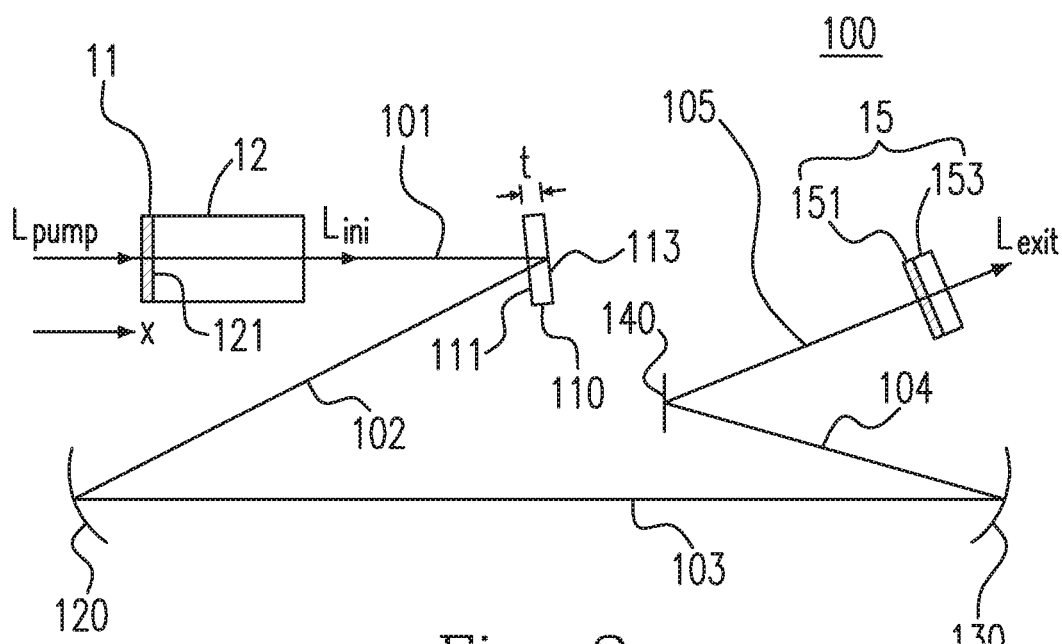
FIG. 2 is a schematic diagram showing a high power nanosecond mode-locked solid state laser apparatus and the method thereof according to one embodiment of the present invention.

Please refer to FIG. 2, which shows one embodiment of the high power nanosecond mode-locked solid state laser apparatus 100 and the method thereof according to the present invention. As illustrated, the solid state laser device 100 includes an optical film 11, an optical gain medium crystal 12, a Fabry-Perot element 110, a first mirror 120, a second mirror 130, a third mirror 140 and an output coupler 15. The optical film 11 is disposed on a surface 121 of the optical gain medium crystal 12 facing the X direction, and receives the pumping light $L_{pump}$ incident in the X direction. According to an embodiment, the pumping light $L_{pump}$ is derived from a diode laser (not shown) having a wavelength of about 808 nm. The optical film 11 has high transmittance to incident lights having a wavelength of about 808 nm, and allows the pumping light $L_{pump}$ to enter the inside of the optical gain medium crystal 12.

The optical gain medium crystal 12 comprises a neodymium doped vanadate (for example, Nd:YVO4), which can absorb the energy of the pumping light $L_{pump}$ via the dopant to release an initial laser beam $L_{ini}$ with a wavelength of about 1064 nm. As shown in FIG. 2, the initial laser beam $L_{ini}$ is projected in the direction along the first light path 101 starting from the surface 121 of the optical gain medium crystal 12 near the optical film 11.

The Fabry-Perot element 110 is disposed on the other end of the first optical path 101 opposite to the one end, and reflects the initial laser beam $L_{ini}$ along a second optical path 102 having one end thereof starting from the Fabry-Perot element 110. The present invention uses a reflected Fabry-Perot element 110 having a first surface 111 and a second surface 113 that are parallel to each other. The first surface 111 has high transmittance or low reflectivity (e.g., reflectivity less than 0.5% or even less than 0.2%) for lights with a wavelength of about 1064 nm, allowing most of the initial laser beam $L_{ini}$ to penetrate, while the second surface 113 has high reflectivity (e.g., having a reflectivity greater than 99.8%). The distance between the first surface 111 and the second surface 113 is the thickness t of the Fabry-Perot element 110. In the relative position, the first surface 111 is closer to the first mirror 120 when compared to the second surface 113, and is also closer to the light source of the incident initial laser beam $L_{ini}$ which is the optical gain medium crystal 12 when compared to the second surface 113, such that the initial laser beam $L_{ini}$ is repeatedly passed through the first surface 111 and reflected by the second surface 113 to generate an effect of Fabry-Perot interference.

The first mirror 120 is disposed on the other end of the second optical path 102 opposite to the one end of the second optical path 102, and reflects the initial laser beam $L_{ini}$ along a third optical path 103 having one end thereof starting from the first mirror 120. The second mirror 130 is disposed on the other end of the third optical path 103 opposite to the one end of the third optical path 103, and reflects the initial laser beam $L_{ini}$ along a fourth optical path 104 having one end thereof starting from the second mirror 130. The third mirror 140 is disposed on the other end of the fourth optical path 104 opposite to the one end of the fourth optical path 104, and reflects the initial laser beam $L_{ini}$ along a fifth optical path 105 having one end thereof starting from the third mirror 140. Basically, the combination of the first mirror 120, the second mirror 130 and the third mirror 140 can be adjusted according to the need so as to achieve a required total length of optical path.

The output coupler 15 is disposed on the other end of the fifth optical path 105 opposite to the one end of the fifth optical path 105, and may be formed of a multilayer thin film stack 151 (for example, 10 layers of aluminum arsenide or gallium arsenide film) disposed on the surface of a transparent semiconductor substrate 153 (for example, a gallium arsenide substrate). When the initial laser beam $L_{ini}$ is under a lower power condition, the multilayer thin film stack 151 of the output coupler 15 has high reflectivity (for example, a reflectivity of about 96.3%), and the initial laser beam $L_{ini}$ is reflected back along the fifth light path 105 in the reverse direction to the third mirror 140.

Due to the reversibility of the optical path, those skilled in the art will appreciate that the initial laser beam $L_{ini}$ may return to the first optical path 101 from the fifth optical path 105 in the opposite direction and eventually arrive at the surface 121 of the optical gain medium crystal 12 with the optical film 11 disposed thereon. The optical film 11 has high reflectivity (for example, a reflectivity of at least 99.8% or higher) in a direction facing the optical gain medium crystal 12, that is, in a direction facing the first optical path 101 for an incident light having a wavelength of about 1064 nm. The initial laser beam $L_{ini}$ can return in the opposite direction along the first optical path 101 all the way to the other end of the fifth optical path 105, that is, the location of the output coupler 15.

The configuration described in the preceding paragraph forms a resonant cavity for the initial laser beam $L_{ini}$. When the sum of the path lengths of the first to fifth optical paths 101-105 is a multiple of a half wavelength ½ λ, of the initial laser beam $L_{ini}$, the initial laser beam $L_{ini}$ will form a standing wave and continue to reciprocate between the optical film 11 and the output coupler 15, and the power of the initial laser beam $L_{ini}$ will be increased as the pumping light $L_{pump}$ being continuously transmitted into the optical gain crystal 12. For example, when the total light path length is 1 meter, a light beam having wavelengths of about 1064 nm can form a standing wave with at least, for example, 1063.9950 nm, 1063.9956 nm, 1063.9962 nm, 1063.9968 nm, 1063.9973 nm, 1063.9978 nm, 1063.9984 nm, 1063.9990 nm, 1063.9996 nm, 1064.0002 nm, 1064.0007 nm, 1064.0012 nm, 1064.0018 nm, 1064.0024 nm, 1064.0030 nm, 1064.0035 nm, 1064.0041 nm, 1064.0046 nm, 1064.0052 nm and so on, wherein each of which can represent a resonant mode. In practice, taking the resonant cavity 10 shown in FIG. 1 for example, the range for wavelengths representing resonant modes can be 0.5 nm or more without using any Fabry-Perot element. Therefore, the total number of modes is thousands to tens of thousands, and there can exist higher numbers of mode count with denser distribution of corresponding wavelengths for the total light path length which is longer. However, the number of modes existing in the laser cavity will be greatly reduced, and the wavelength distribution will be more concentrated, after a mode selection by means of the Fabry-Perot element.

Referring again to FIG. 2, as the pumping light $L_{pump}$ is continuously injected into the optical gain medium crystal 12 to increase the power of the initial laser beam $L_{ini}$, the multilayer thin film stack 151 of the output coupler 15 will exhibit a high transmittance (e.g., a reflectivity of less than 5% or even less than 2%) and thereby transmits a laser pulse $L_{exit}$ out of the solid state laser apparatus 100 when the intensity of the initial laser beam $L_{ini}$ reaches a threshold. After the high-power laser light or pulse is released, the intensity of the initial laser beam $L_{ini}$ is lowered to an extremely low condition so that the multilayer thin film stack 151 of the output mirror 15 returns to a high reflectivity state, and the power of the initial laser beam $L_{ini}$ in the solid state laser apparatus 100 is again increased as the pumping light $L_{pump}$ continues to be injected into the optical gain medium crystal 12. As a result, an intermittent solid-state laser pulse is continuously generated, and can provide various industrial applications.

Figure 3:
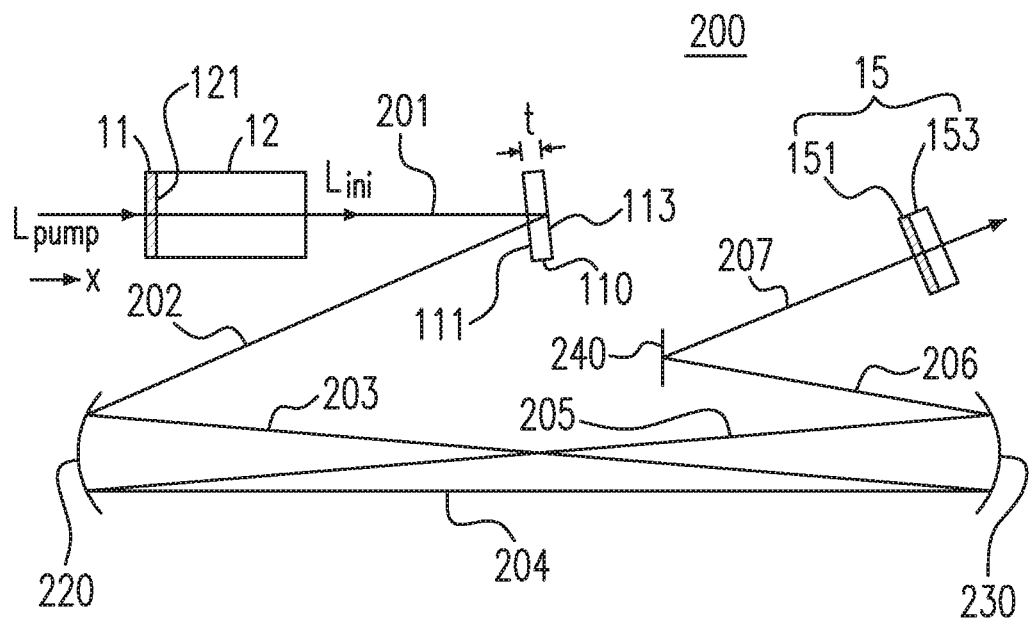
FIG. 3 is a schematic diagram showing a high power nanosecond mode-locked solid state laser apparatus and the method thereof according to another embodiment of the present invention.

Please refer to FIG. 3, which shows a high power nanosecond mode-locked solid state laser apparatus 200 and the method thereof, of, according to a second embodiment of the present invention. According to FIG. 3, the solid state laser device 200 includes an optical film 11, an optical gain medium crystal 12, a Fabry-Perot element 110, a first mirror 220, a second mirror 230, a third mirror 240, and an output coupler 15. The same as the preceding embodiment, the optical film 11 is disposed on a surface 121 of the optical gain medium crystal 12 facing the X direction, and receives the pumping light $L_{pump}$ incident in the X direction. The optical film 11 has high transmittance to incident lights, and allows the pumping light $L_{pump}$ to enter the inside of the optical gain medium crystal 12. Detailed embodiments for the optical gain medium crystal 12, the Fabry-Perot element 110, the first mirror 220, the second mirror 230, the third mirror 240 and the output coupler 15 are the same as the ones set forth above, and thus there is no need to repeat.

The initial laser beam $L_{ini}$ is projected in the direction along the first light path 201 starting from the surface 121 of the optical gain medium crystal 12 near the optical film 11. The Fabry-Perot element 110 is disposed on the other end of the first optical path 201 opposite to the one end, and reflects the initial laser beam $L_{ini}$ along a second optical path 202 having one end thereof starting from the Fabry-Perot element 110. The first mirror 220 is disposed on the other end of the second optical path 202 opposite to the one end of the second optical path 202, and reflects the initial laser beam $L_{ini}$ along a third optical path 203 having one end thereof starting from the first mirror 220. The second mirror 230 is disposed on the other end of the third optical path 203 opposite to the one end of the third optical path 203, and reflects the initial laser beam $L_{ini}$ along a fourth optical path 204 having one end thereof starting from the second mirror 230 back to the first mirror 220. The first mirror is disposed at the other end of the fourth optical path 204 opposite to the one end of the fourth optical path 204, and reflects the initial laser beam $L_{ini}$ along a fifth optical path 205 having one end thereof starting from the first mirror 220 and the other end at the second mirror 230. The second mirror 230 reflects the initial laser beam $L_{ini}$ along a sixth optical path 206 having one end thereof starting from the second mirror 230. The third mirror 240 is disposed on the other end of the sixth optical path 206 opposite to the one end of the sixth optical path 206, and reflects the initial laser beam $L_{ini}$ along a seventh optical path 207 having one end thereof starting from the third mirror 240.

The output coupler 15 is disposed on the other end of the seventh optical path 207 opposite to the one end of the seventh optical path 207. When the initial laser beam $L_{ini}$ is under a lower power condition, the multilayer thin film stack 151 of the output coupler 15 has high reflectivity (for example, a reflectivity of about 96.3%), and the initial laser beam $L_{ini}$ is reflected back along the seventh light path 207 in the reverse direction to the third mirror 240. On the other hand, when the intensity of the initial laser beam $L_{ini}$ reaches a threshold, the multilayer thin film stack 151 of the output coupler 15 will exhibit a high transmittance (e.g., a reflectivity of less than 5% or even less than 2%) and thereby transmits a laser pulse $L_{exit}$ out of the solid state laser apparatus 200.

In the embodiment as shown in FIG. 3, the combination of the first mirror 220, the second mirror 230 and the third mirror 240 can be adjusted according to the need so as to achieve a required total length of optical path. It is appreciated that, for the need of increasing the total length of the optical path in the cavity, the first and the second mirrors 220, 230 are concave mirrors so a couple of additional optical paths 204, 205 exist therebetween, compared with the embodiment shown in FIG. 2. As a result, the total number of available wavelengths about 1064 nm for forming standing waves can be increased. That is to say, the number of modes existing in the resonant cavity can be increased by such a manner. The skilled person in the art can choose appropriate combinations of mirrors to configure the needed optical paths, without going beyond the scope of the present invention.

Figure 4:
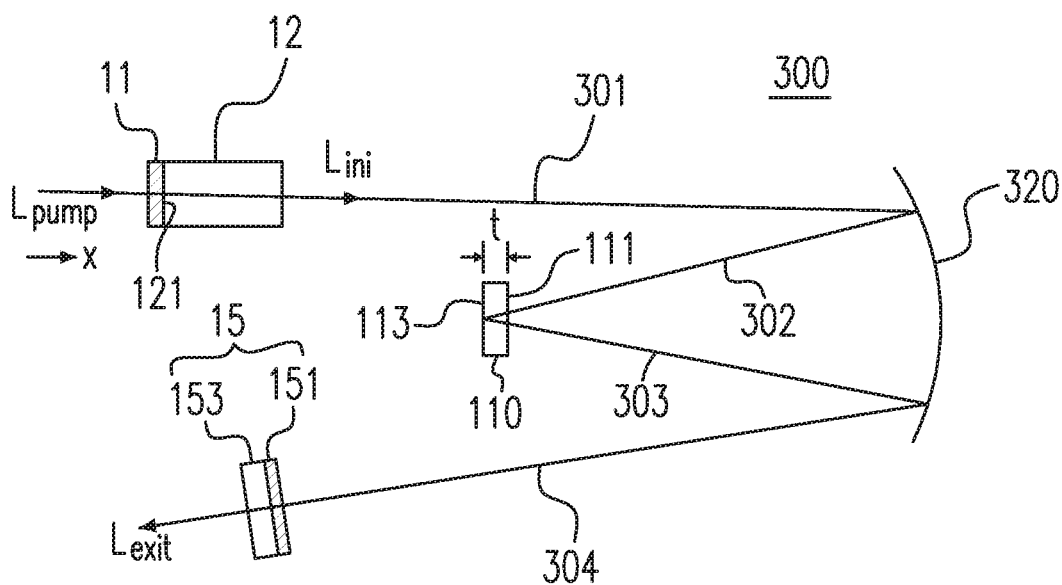
FIG. 4 is a schematic diagram showing a high power nanosecond mode-locked solid state laser apparatus and the method thereof according to another embodiment of the present invention.

In the embodiments shown in FIGS. 2 and 3, the Fabry-Perot element 110 is placed in the light path at the position where the initial laser beam $L_{ini}$ is first received. In a different embodiment, the Fabry-Perot element 110 can also be arranged at a relatively intermediate position in the light path. Please refer to FIG. 4, which shows a high power nanosecond mode-locked solid state laser apparatus 300 and the method thereof of, according to a third embodiment of the present invention. According to FIG. 4, the solid state laser device 300 includes an optical film 11, an optical gain medium crystal 12, a concave mirror 320, a Fabry-Perot element 110 and an output coupler 15. The same as the preceding embodiments, technical features of the optical film 11, the optical gain medium crystal 12, the Fabry-Perot element 110 and the output coupler 15 are the same as the ones set forth above, and thus there is no need to repeat.

The optical film 11 is disposed on a surface 121 of the optical gain medium crystal 12 facing the X direction, and receives the pumping light $L_{pump}$ incident in the X direction. The optical film 11 has high transmittance to incident lights, and allows the pumping light $L_{pump}$ to enter the inside of the optical gain medium crystal 12 for generating an initial laser beam $L_{ini}$. The initial laser beam is projected along a first optical path 301 starting at one end thereof from the surface 121 of the optical gain medium crystal 12 near the optical film 11. The concave mirror 320 is disposed on the other end of the first optical path 301 opposite to the one end of the first optical path 301, and reflects the initial laser beam $L_{ini}$ along a second optical path 302 starting at one end thereof from the concave mirror 320. The Fabry-Perot element 110 is disposed on the other end of the second optical path 302 opposite to the one end thereof, and reflects the initial laser beam $L_{ini}$ back to the concave mirror 320 along a third optical path 303 so as to have the initial laser beam $L_{ini}$ reflected by the concave mirror 320 along a fourth optical path 304 starting at one end thereof from the concave mirror 320.

The output coupler 15 is disposed on the other end of the fourth optical path 304 opposite to the one end of the fourth optical path 304, and may be formed of a multilayer thin film stack 151 (for example, 10 layers of aluminum arsenide or gallium arsenide film) disposed on the surface of a transparent semiconductor substrate 153 (for example, a gallium arsenide substrate). When the initial laser beam $L_{ini}$ is under a lower power condition, the multilayer thin film stack 151 of the output coupler 15 has high reflectivity (for example, a reflectivity of about 96.3%), and the initial laser beam $L_{ini}$ is reflected back along the fourth light path 304 in the reverse direction to the concave mirror 320. On the other hand, when the intensity of the initial laser beam $L_{ini}$ reaches a threshold, the multilayer thin film stack 151 of the output coupler 15 will exhibit a high transmittance (e.g., a reflectivity of less than 5% or even less than 2%) and thereby transmits a laser pulse $L_{exit}$ out of the solid state laser apparatus 300.

The Fabry-Perot element 110 has a first surface 111 and a second surface 113 that are parallel to each other. The first surface 111 has high transmittance or low reflectivity (e.g., reflectivity less than 0.5% or even less than 0.2%) for lights with a wavelength of about 1064 nm, allowing most of the initial laser beam $L_{ini}$ to penetrate, while the second surface 113 has high reflectivity (e.g., having a reflectivity greater than 99.8%). The distance between the first surface 111 and the second surface 113 is the thickness t of the Fabry-Perot element 110. In the relative position, the first surface 111 is closer to the concave mirror 320 when compared to the second surface 113, such that the initial laser beam $L_{ini}$ is repeatedly passed through the first surface 111 and reflected by the second surface 113 to generate an effect of Fabry- Perot interference. In the embodiments shown in FIGS. 2-4, the present invention replaces one of the mirrors in the laser resonate cavity with a reflected Fabry-Perot element for generating the Fabry-Perot interference in the optical path of the laser beam, which can effectively achieve the efficacy of mode selection.

Figure 5:
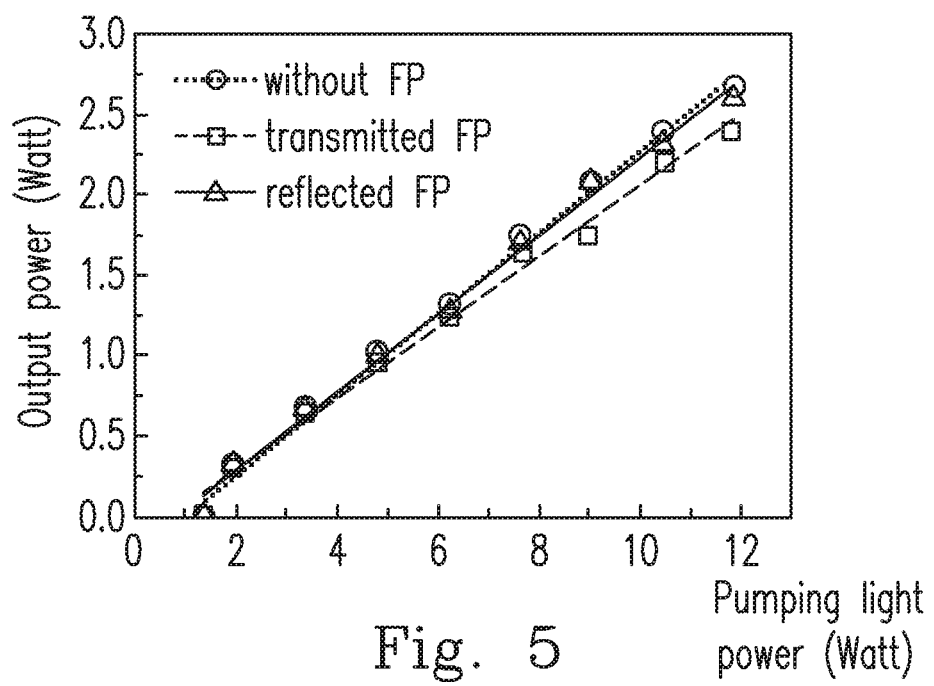
FIG. 5 is a schematic diagram showing a comparison between the powers of the mode-locked solid state laser according to the present invention and that of the traditional mode-locked solid state laser.

Please refer to FIG. 5, which shows a comparison between the powers of the mode-locked solid state laser according to the present invention and that of the traditional mode-locked solid state laser. It can be seen from FIG. 5 that, the present invention can achieve a laser pulse of almost the same output power as a conventional solid-state laser resonant cavity with the same power pumping light input by using the reflected Fabry-Perot element. However, the method of using the traditional transmitted Fabry-Perot element ends up with lower power output as predicted, due to the additional optical elements in the optical path.

Figure 1:
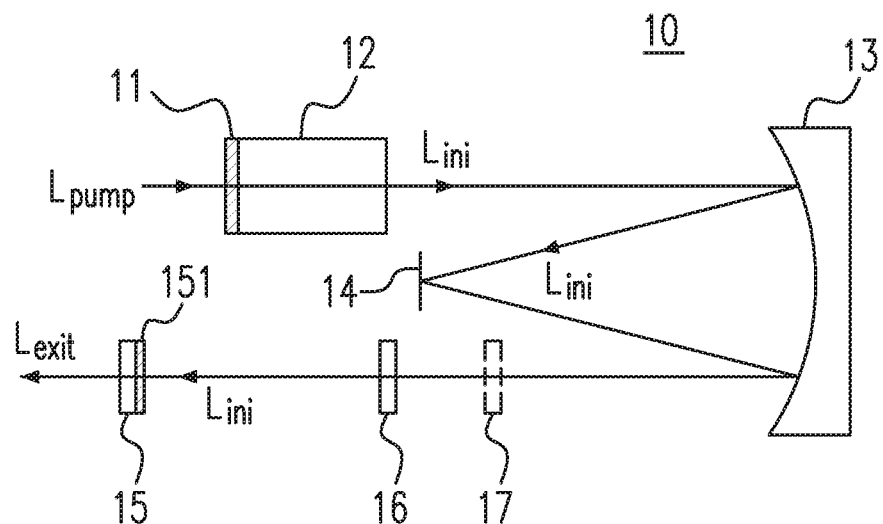
FIG. 1 is a schematic diagram showing configuration of a solid-state laser resonant cavity known to the art.
Figure 6:
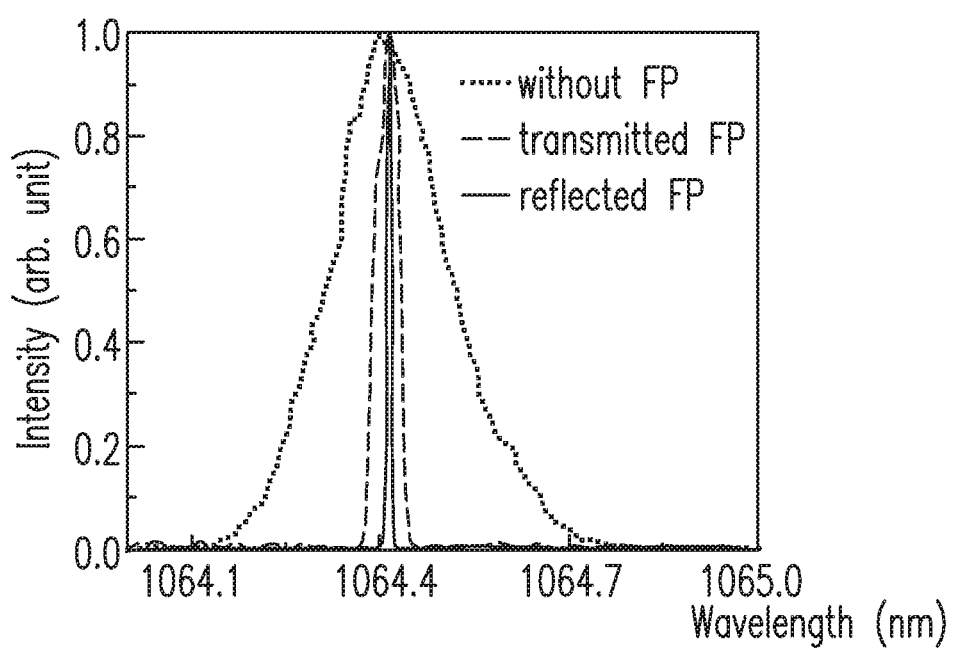
FIG. 6 is a schematic diagram showing a comparison between the mode types of the mode-locked solid state laser according to the present invention and that of the traditional mode-locked solid state laser.

Please refer to FIG. 6, which shows a comparison between the mode types of the mode-locked solid state laser according to the present invention and that of the traditional mode-locked solid state laser. According to the illustration in FIG. 6, a solid-state laser device that does not use any mode-locking tool (such as the device shown in FIG. 1) has a modal distribution width of the output pulse that is relatively wide (a range of about 0.6 nm); using a conventional transmitted Fabry-Perot element (for example, a transmitted Fabry-Perot element 16 is added into the device configuration as shown in FIG. 1) can obtain a narrower distribution of the modal distribution of the output pulse (roughly 0.1 nm); and the solid-state laser device (for example, the device configuration shown in FIG. 4) using a reflected Fabry-Perot element can obtain excellent mode selection efficiency, and the output pulse has the narrowest modal distribution width (less than 0.003 nm, which is hard to identified in the illustration of FIG. 6).

Figure 7:
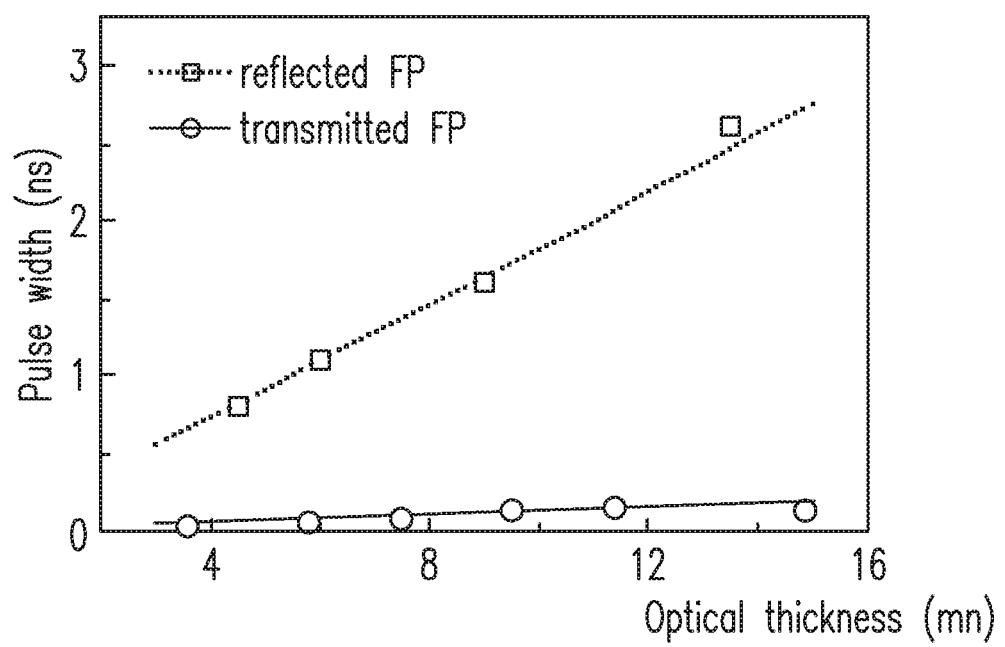
FIG. 7 is a schematic diagram showing a comparison between the mode selection effects of the mode-locked solid state laser according to the present invention and that of a mode-locked solid state laser equipped with a traditional Fabry-Perot element.

Please refer to FIG. 7, which shows a comparison between the mode selection effects of the mode-locked solid state laser according to the present invention and that of a mode-locked solid state laser equipped with a traditional Fabry-Perot element. Those skilled in the art can understand that the mode and bandwidth of the laser pulses are related parameters of different perspectives, so we can choose to observe the bandwidth of the laser pulse light to know the effect of the mode selection. Comparing the thickness of the Fabry-Perot element (the distance between the two parallel surfaces) and the bandwidth of the generated laser pulses, one can find a significant linear relationship between the thickness and the bandwidth of the laser pulse. Therefore, according to an embodiment of the invention, the control of width t can be used to control the bandwidth of the output laser pulse $L_{exit}$. On the contrary, the bandwidth of the output laser pulse is not significantly affected by the thickness when using the transmitted Fabry-Perot element, so the purpose of bandwidth adjustment cannot be achieved by means of controlling component thickness. It will be apparent that the method and apparatus of the present invention can fully and effectively achieve the efficacy of mode selection.

Through the abovementioned embodiments, the Raman laser for generating high-power and multiple-wavelength laser lights with visible wavelengths according to the present invention may use the linear resonance cavity under the same configuration, and can obtain high-power visible laser lights with different wavelengths by means of different device arrangement, which is a technology breakthrough.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A mode-locked solid state laser apparatus, comprising:
an optical film receiving a pumping light having a first wavelength incident in a first direction;
a gain medium crystal receiving the pumping light passing the optical film, and generating an initial laser beam having a second wavelength, wherein the initial laser beam forms a first optical path starting at one end thereof from the gain medium crystal;
a Fabry-Perot element, disposed on the other end of the first optical path opposite to the one end, and reflecting the initial laser beam along a second optical path having one end thereof starting from the Fabry-Perot element;
a first mirror, disposed on the other end of the second optical path opposite to the one end of the second optical path, and reflecting the initial laser beam along a third optical path having one end thereof starting from the first mirror;
a second mirror, disposed on the other end of the third optical path opposite to the one end of the third optical path, and reflecting the initial laser beam along a fourth optical path having one end thereof starting from the second mirror;
a third mirror disposed on the other end of the fourth optical path opposite to the one end of the fourth optical path, and reflecting the initial laser beam along a fifth optical path having one end thereof starting from the third mirror; and
an output coupler disposed on the other end of the fifth optical path opposite to the one end of the fifth optical path, and reflecting the initial laser beam back to the third mirror along the fifth optical path, wherein:
the optical film has a first relatively high transmittance for a light at the first wavelength and a first relatively high reflectivity for a light at the second wavelength;
the Fabry-Perot element includes a first surface and a second surface parallel to the first surface, wherein the first surface is closer to the first mirror when compared to the second surface and has a second relatively high transmittance, and the second surface has a second relatively high reflectivity; and
the output coupler has an initial transmittance, and on a condition when an intensity of the initial laser beam reaches a threshold value, the output coupler has a third relatively high transmittance and allows an output laser pulse to emit out of the laser apparatus.

2. The apparatus according to claim 1, wherein the gain medium crystal includes a neodymium-doped vanadate.

3. The apparatus according to claim 1, wherein the optical film is disposed on the gain medium crystal.

4. The apparatus according to claim 1, wherein the output coupler is formed of a multi-layered thin-film stack on a semiconductor substrate.

5. The apparatus according to claim 1, wherein the first mirror is a concave mirror.

6. The apparatus according to claim 1, wherein the second mirror is a concave mirror.

7. The apparatus according to claim 1, wherein the first and the second surfaces have a thickness therebetween, and the output laser pulse has a pulse width having a linear correlation with the thickness.

8. A mode-locked solid state laser apparatus, comprising:
an optical film receiving a pumping light having a first wavelength incident in a first direction;
a gain medium crystal receiving the pumping light passing the optical film, and generating an initial laser beam having a second wavelength, wherein the initial laser beam forms a first optical path starting at one end thereof from the gain medium crystal;
a concave mirror, disposed on the other end of the first optical path opposite to the one end of the first optical path, and reflecting the initial laser beam along a second optical path starting at one end thereof from the concave mirror,
a Fabry-Perot element, disposed on the other end of the second optical path opposite to the one end thereof, and reflecting the initial laser beam back to the concave mirror so as to reflect the initial laser beam by the concave mirror along a third optical path starting at one end thereof from the concave mirror, wherein the Fabry-Perot element includes a first surface and a second surface parallel to the first surface, and the first surface is closer to the concave mirror when compared to the second surface; and
an output coupler disposed on the other end of the third optical path opposite to the one end thereof, and reflecting the initial laser beam back to the concave mirror along the third optical path.

9. The apparatus according to claim 8, wherein the optical film has a first relatively high transmittance for a light at the first wavelength and a first relatively high reflectivity for a light at the second wavelength.

10. The apparatus according to claim 9, wherein the first surface faces towards the concave mirror and has a second relatively high transmittance, and the second surface has a second relatively high reflectivity.

11. The apparatus according to claim 10, wherein the output coupler has an initial transmittance, and on a condition when an intensity of the initial laser beam reaches a threshold value, the output coupler has a third relatively high transmittance and releases an output laser pulse.

12. The apparatus according to claim 8, wherein the gain medium crystal includes a neodymium-doped vanadate.

13. The apparatus according to claim 8, wherein the optical film is disposed on the gain medium crystal.

14. The apparatus according to claim 8, wherein the output coupler is formed of a multi-layered thin-film stack on a semiconductor substrate.

15. The apparatus according to claim 8, wherein the first and the second surfaces have a thickness therebetween, and the output laser pulse has a pulse width having a linear correlation with the thickness.

16. A method for adjusting a pulse width of a solid-state laser pulse, comprising steps of:
providing a solid state laser device, including:
an optical film receiving a pumping light having a first wavelength incident in a first direction;
a gain medium crystal receiving the pumping light passing the optical film, and generating an initial laser beam having a second wavelength, wherein the initial laser beam forms a first optical path starting at one end thereof from the gain medium crystal;
a concave mirror, disposed on the other end of the first optical path opposite to the one end thereof, and reflecting the initial laser beam along a second optical path starting at one end thereof from the concave mirror,
a Fabry-Perot element, disposed on the other end of the second optical path opposite to the one end thereof, and reflecting the initial laser beam back to the concave mirror so as to reflect the initial laser beam by the concave mirror along a third optical path starting at one end thereof from the concave mirror, wherein the Fabry-Perot element includes a first surface and a second surface parallel to the first surface, and a thickness is defined between the first and the second surfaces, wherein the first surface is closer to the concave mirror when compared to the second surface and has a first relatively high transmittance, and the second surface has a first relatively high reflectivity; and
an output coupler disposed on the other end of the third optical path opposite to the one end thereof, and releasing the solid-state laser pulse having the pulse width; and
controlling the thickness to adjust the pulse width.

17. The method according to claim 16, wherein the optical film has a second relatively high transmittance for a light at the first wavelength.

18. The method according to claim 16, wherein the optical film has a second relatively high reflectivity for a light at the second wavelength.

19. The method according to claim 16, further comprising a step of disposing the optical film on the gain medium crystal.

20. The method according to claim 16, wherein the output coupler is formed of a multi-layered thin-film stack on a semiconductor substrate.

* * * * *